(12) United States Patent
Shibata

(10) Patent No.: US 8,039,130 B2
(45) Date of Patent: Oct. 18, 2011

(54) METHOD OF FORMING GROUP-III NITRIDE CRYSTAL, LAYERED STRUCTURE AND EPITAXIAL SUBSTRATE

(75) Inventor: Tomohiko Shibata, Nagoya (JP)

(73) Assignees: NGK Insulators, Ltd., Nagoya (JP); Dowa Electronics Materials Co., Ltd., Chiyoda-Ku (JP)

( * ) Notice: Subject to any disclaimer, the term of this patent is extended or adjusted under 35 U.S.C. 154(b) by 0 days.

(21) Appl. No.: 12/234,022

(22) Filed: Sep. 19, 2008

(65) Prior Publication Data

US 2009/0017333 A1 Jan. 15, 2009

Related U.S. Application Data

(62) Division of application No. 11/503,831, filed on Aug. 14, 2006, now Pat. No. 7,445,672.

(30) Foreign Application Priority Data

Aug. 18, 2005 (JP) ................. 2005-237587

(51) Int. Cl.
*B32B 9/00* (2006.01)
*B32B 19/00* (2006.01)

(52) U.S. Cl. ........................ 428/698; 428/699

(58) Field of Classification Search .......... 428/698, 428/699
See application file for complete search history.

(56) References Cited

U.S. PATENT DOCUMENTS

| 6,623,877 | B2 | 9/2003 | Shibata et al. | |
| 6,709,703 | B2 | 3/2004 | Shibata et al. | |
| 6,764,871 | B2 * | 7/2004 | Kawaguchi et al. | 438/46 |
| 6,924,159 | B2 | 8/2005 | Usui et al. | |
| 6,989,202 | B2 | 1/2006 | Asai et al. | |
| 7,190,001 | B2 | 3/2007 | Taki | |
| 2002/0043208 | A1* | 4/2002 | Biwa et al. | 117/94 |
| 2002/0197825 | A1* | 12/2002 | Usui et al. | 438/459 |
| 2003/0085411 | A1* | 5/2003 | Shibata et al. | 257/190 |
| 2003/0183157 | A1* | 10/2003 | Usui et al. | 117/84 |
| 2004/0067648 | A1* | 4/2004 | Morita et al. | 438/689 |
| 2005/0287774 | A1* | 12/2005 | Shibata et al. | 438/502 |
| 2006/0046325 | A1* | 3/2006 | Usui et al. | 438/21 |

FOREIGN PATENT DOCUMENTS

| JP | 09-064477 | 3/1997 |
| JP | 2002-222771 | 8/2002 |
| JP | 2003-178984 A1 | 6/2003 |
| JP | 2004-119807 A1 | 4/2004 |
| JP | 2005-093682 A1 | 4/2005 |

\* cited by examiner

*Primary Examiner* — Jennifer C McNeil
*Assistant Examiner* — Jonathan Langman
(74) *Attorney, Agent, or Firm* — Burr & Brown

(57) ABSTRACT

Heat treatment is conducted at a predetermined temperature of not less than 1250° C. on an underlying substrate obtained by epitaxially forming a first group-III nitride crystal on a predetermined base as an underlying layer. Three-dimensional fine irregularities resulting from crystalline islands are created on the surface of the underlying layer. A second group-III nitride crystal is epitaxially formed on the underlying substrate as a crystal layer. There are a great many fine voids interposed at the interface between the crystal layer and underlying substrate. The presence of such voids suppresses propagation of dislocations from the underlying substrate, which reduces the dislocation density in the crystal layer. As a result, the crystal layer of good crystal quality can be obtained.

2 Claims, 5 Drawing Sheets

FIG. 5

| | HEAT TREATMENT CONDITIONS | UNDERLYING LAYER BEFORE HEAT TREATMENT | | | UNDERLYING LAYER AFTER HEAT TREATMENT | | | CRYSTAL LAYER | |
|---|---|---|---|---|---|---|---|---|---|
| | | FWHM (sec) (0002) PLANE (above) (10-12) PLANE (below) | DISLOCATION DENSITY (/cm²) | ra (nm) | FWHM (sec) (0002) PLANE (above) (10-12) PLANE (below) | DISLOCATION DENSITY (/cm²) | ra (nm) | FWHM (sec) (0002) PLANE (above) (10-12) PLANE (below) | DISLOCATION DENSITY (/cm²) |
| INVENTIVE EXAMPLE CONDITION 1 | 1650°C 10 min | 90 / 2000 | 5×10¹⁰ | 1~5 | 120 / 800 | 5×10⁹ | 1~5 | 200 / 400 | 1×10⁹ |
| INVENTIVE EXAMPLE CONDITION 2 | 1550°C 10 hr | | | | 120 / 800 | 5×10⁹ | 1~5 | 200 / 400 | 1×10⁹ |
| INVENTIVE EXAMPLE CONDITION 3 | 1450°C 20 hr | | | | 120 / 1100 | 5×10¹⁰ | 1~5 | 200 / 700 | 4×10⁹ |
| COMPARATIVE EXAMPLE 1 | NO HEAT TREATMENT | | | | - | - | - | 150 / 1100 | 1×10¹⁰ |
| COMPARATIVE EXAMPLE 2 | 1650°C 2 hr | | | | 150 / 750 | 5×10⁹ | 0.3 | 200 / 700 | 4×10⁹ |

METHOD OF FORMING GROUP-III NITRIDE CRYSTAL, LAYERED STRUCTURE AND EPITAXIAL SUBSTRATE

CROSS REFERENCE TO RELATED APPLICATION

This application is a division of U.S. application Ser. No. 11/503,831, now U.S. Pat. No. 7,445,672, filed Aug. 14, 2006, the entirety of which is incorporated herein by reference.

BACKGROUND OF THE INVENTION

1. Field of the Invention

The present invention relates to a technique for improving the crystal quality of a group-III nitride crystal 2. Description of the Background Art A group-III nitride crystal has been used as a material constituting a semiconductor device such as a photonic device and an electronic device, and has recently received attention as a semiconductor material constituting a rapid IC chip for use in a portable telephone. Attention is particularly being given to an AlN film as a material for application to a field emitter.

For such device applications, a group-III nitride crystal is ideally provided as free-standing one. Under the current circumstances, however, a group-III nitride crystal is typically provided in the form of a so-called epitaxial substrate epitaxially formed on a predetermined single crystal base considering problems with crystal quality, manufacturing costs and the like. In general, thin film formation methods such as an MOCVD (metal-organic chemical vapor deposition) process and an MBE (molecular beam epitaxy) process are used to form such an epitaxial substrate.

It is necessary to improve the crystal quality as much as possible in order to increase the performance of a functional device when a group-III nitride crystal is intended to function as the functional device. For instance, when an epitaxial substrate is used for a functional device, it is typical that a single crystal layer is further formed on the epitaxial substrate. In order to provide the single crystal layer with a good crystal quality, it is necessary to minimize the dislocation density in the surface of a group-III nitride crystal constituting the epitaxial substrate. The reduction in dislocation density promises to achieve, for example, an increase in light emitting efficiency for a light-emitting device, a decrease in dark current for a photodetector device, and an increase in mobility for an electronic device.

In such an epitaxial substrate, however, a lattice mismatch between the base and the group-III nitride crystal to give rise to dislocations at an interface therebetween. Such dislocations thread through into the surface of the group-III nitride crystal. Accordingly, the crystal quality of the obtained group-III nitride crystal is not necessarily sufficient. For application to a functional device, an improvement in such crystal quality is required, and therefore, various methods have been proposed so far.

Particularly for achieving a light receiving/emitting device of short wavelength, it is important to form a group-III nitride film containing Al and having a low dislocation density. In this connection, there is a method by which a group-III nitride film at least containing Al and AlN are grown at high temperatures to be used as an underlying layer (e.g., Japanese Patent Application Laid-Open No. 9-64477 (1997)). This JP 9-64477 further discloses a technique for annealing a buffer layer at high temperatures to remove strains.

In addition, a method is proposed by which a group-III nitride film at least containing Al is grown at high temperatures with irregularities to be used as an underlying layer (Japanese Patent Application Laid-Open No. 2002-222771).

The technique disclosed in JP 9-64477 can form a group-III nitride film containing Al, but does not reduce the dislocation density to a sufficient degree. The technique disclosed in JP 2002-222771 can also form a group-III nitride film containing Al, but the use of this technique does not reduce the dislocation density in an underlying layer to a sufficient degree. Further reduction in dislocation density has therefore been required.

SUMMARY OF THE INVENTION

The present invention is directed to a technique for improving the crystal quality of a group-III nitride crystal.

According to the present invention, a method of forming a group-III nitride crystal comprises the steps of: a) epitaxially forming an underlying layer made of a first group-III nitride on a predetermined base; b) changing a surface geometry of the underlying layer by a predetermined geometry changing process different from an epitaxial forming process; and c) epitaxially forming a crystal layer made of a second group-III nitride on the underlying layer having undergone the step b). The predetermined geometry changing process is to increase the frequency of fine irregularities on a surface of the underlying layer as compared to before the predetermined geometry changing process. Alternatively, the predetermined geometry changing process is to promote formation of a textured geometry on a surface of the underlying layer as compared to before the predetermined geometry changing process.

Epitaxially forming the crystal layer on the underlying substrate with fine irregularities having undergone the geometry changing process can achieve formation of the crystal layer made of a group-III nitride having a good crystal quality with reduced dislocation density.

Preferably, in the step c), the crystal layer is formed such that voids resulting from the surface geometry exist in a distributed manner at an interface between the crystal layer and the underlying layer.

Accordingly, the presence of voids at the interface suppresses propagation of dislocations into the crystal layer. Therefore, a crystal layer made of a group-III nitride having a good crystal quality with reduced dislocation density, and a layered structure or an epitaxial substrate having that crystal layer can be provided.

Preferably, the geometry changing process is a heating process for heating the underlying layer including the base at a heating temperature higher than a temperature for forming the underlying layer.

In this case, a simple process of heating can change the surface geometry of the underlying layer into a desired one. Further, it is possible to cause edge dislocations to disappear effectively in the underlying layer. Therefore, a crystal layer made of a group-III nitride having a good crystal quality with reduced dislocation density can be formed on the underlying layer, and a layered structure or an epitaxial layer having that crystal layer can be provided.

It is therefore an object of the present invention to provide a group-III nitride crystal of better crystal quality than conventional, and a method of forming thereof.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a table of numeric values of heat treatment conditions as well as numeric values of crystal quality of an obtained underlying layer and a crystal layer according to an inventive example and comparative examples.

DETAILED DESCRIPTION OF THE INVENTION

Figure 1:
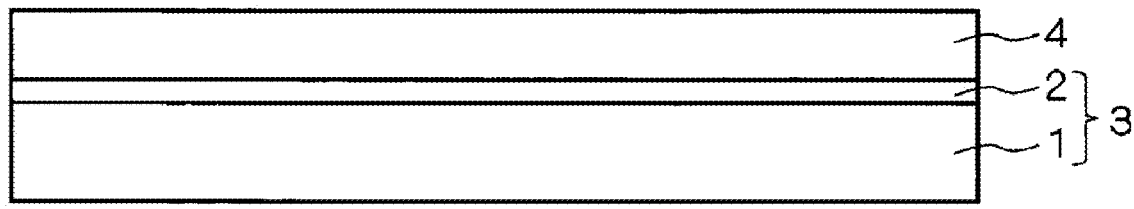
FIG. 1 is an outline sectional schematic view of a layered structure including a crystal layer made of a group-III nitride crystal according to a preferred embodiment of the present invention.

FIG. 1 is an outline sectional schematic view of a layered structure 10 including a crystal layer 4 made of a group-III nitride crystal according to a preferred embodiment of the present invention. The layered structure 10 is obtained by epitaxially forming the crystal layer 4 on an underlying substrate 3 which is a so-called epitaxial substrate obtained by epitaxially forming an underlying layer 2 on a base 1. For purposes of illustration, the thicknesses and aspect ratios of respective layers shown in FIG. 1 are not drawn to scale. Further, while FIG. 1 illustrates the interface between the underlying layer 2 and crystal layer 4 linearly, there is no such restriction in practice as will be described later.

The material of the base 1 is appropriately selected in accordance with the composition and structure of the underlying layer 2 to be formed thereon or the technique of forming respective layers including layers to be further formed on the underlying layer 2. For example, a substrate of SiC (silicon carbide) or sapphire is used as the base 1. Alternatively, the material of the base 1 may be appropriately selected from the group consisting of: oxide materials such as ZnO, $LiAlO_2$, $LiGaO_2$, $MgAl_2O_4$, $(LaSr)(AlTa)O_3$, $NdGaO_3$ and MgO; group-IV single crystals such as Si and Ge; IV-IV compounds such as SiGe; III-V compounds such as GaAs, AlN, GaN and AlGaN; and single crystals of borides such as $ZrB_2$. Of these materials, for example, (0001) SiC, or (11-20) and (0001) sapphire may be used as the material of the base 1 when a group-III nitride crystal having a main surface coincident with the (0001) plane thereof is provided as the underlying layer 2. For example, (11-20) SiC or (10-12) sapphire may be used as the material of the base 1 when a group-III nitride crystal having a main surface coincident with the (11-20) plane thereof is provided as the underlying layer 2. There are no special material limitations on the thickness of the base 1, but the base 1 having a thickness ranging from hundreds of micrometers to several millimeters is preferable for convenience of handling.

For optical device applications in the ultraviolet region, it is desirable to use a material transparent to light of an operating wavelength for the base 1, and sapphire is most preferable as the material of the base 1 in the light of compatibility with the crystal structure of the group-III nitride. For applications to high-power optical devices and to electronic devices requiring a heat dissipation property, it is most preferable to use SiC having a high thermal conductivity.

The underlying layer 2 is formed on the base 1. The underlying layer 2 is an epitaxial film made of a first group-III nitride crystal and formed by a known deposition technique such as an MOCVD process, an MBE process, an HVPE process (a vapor-phase epitaxy process using hydride), and a sputtering process. The MOCVD process may be used in combination with a PALE (Pulsed Atomic Layer Epitaxy) process, a plasma assisted process or a laser assisted process. The MBE process may also be used in combination with similar techniques. The growth methods such as the MOCVD process and the MBE process, which are capable of controlling the manufacturing conditions with high accuracy, are suitable for the growth of a high-quality crystal. The HVPE process, on the other hand, is suitable for the growth of a thick film in a short time because this process can supply a large amount of raw material at a time. These processes may be combined together during the formation of the underlying layer 2. When using the MOCVD process, for example, the underlying layer 2 can be formed setting the temperature of the base 1 at not more than 1250° C.

In the present embodiment, the group-III nitride crystal refers to a crystal with a composition represented by $B_xAl_yGa_zIn_{1-x-y-z}N$ (where x, y, z≧0) and having a wurtzite structure or a zincblende structure. The first group-III nitride preferably has an Al content of not less than 80 mole percent of all of the group-III elements (y≧0.8), and AlN (y=1.0) is more preferable among others. Forming the underlying layer 2 of AlN is most desirable in the light of quality control because AlN presents no problems of variations resulting from compositional inhomogeneity and the like. It has been confirmed that the crystal quality of the crystal layer 4 when forming the underlying layer 2 of a group-III nitride where y≧0.8 is almost equivalent to that when forming the underlying layer 2 of AlN.

In terms of suppressing cracks in the crystal layer 4, an inplane lattice constant in a direction perpendicular to the direction of epitaxial growth in the first group-III nitride is preferably less than a lattice constant of a second group-III nitride crystal constituting the crystal layer 4 which will be described later. For instance, when forming the underlying layer 2 and crystal layer 4 of group-III nitrides where x=0, respectively, the occurrence of cracks in the crystal layer 4 is suppressed by making the composition of the first group-III nitride constituting the underlying layer 2 richer in Al than the second group-III nitride constituting the crystal layer 4, because the lattice constant decreases as the value of y increases, that is, as the nitride is richer in Al. Further, as the underlying layer 2 is richer in Al, the crystal layer 4 can cover a wider range of compositions.

However, when the lattice constant of the first group-III nitride crystal is higher than the lattice constant of the second group-III nitride crystal only with a little difference, a critical thickness that causes cracks is considered relatively large. It is therefore practically possible to form the crystal layer 4 in a thickness that can be applied to a device without causing cracks.

The MOCVD process or the MBE process, in which a growth rate is several micrometers per hour at the most, can be said to be a preferable technique for forming the AlN epitaxial film having the main surface coincident with the (0001) plane thereof as the underlying layer 2. To form the underlying layer 2 as described above in particular by the MOCVD process using trimethylaluminum and ammonia, it is desirable that the temperature of the substrate itself be not less than 1100° C. This is because screw dislocations in the underlying layer 2 before heat treatment to be described next are effectively suppressed, and further because a state closer to a state of equilibrium is achieved by reducing the growth rate to a low value and raising the temperature of the substrate itself. A reduced-pressure atmosphere is used in which the pressure during the growth is not less than 1 Torr, preferably not more than 100 Torr, more preferably not more than 20 Torr. It is also desirable that a supply ratio between trimethylaluminum and ammonia be not more than 1:500, more preferably not more than 1:200. This can efficiently suppress the reactions of raw materials in a vapor phase.

In the present embodiment, when forming the layered structure 10, the underlying substrate 3 including the underlying layer 2 is subjected to heat treatment to be heated by a predetermined processing apparatus at a temperature of at least not less than 1250° C., preferably not less than 1400° C., more preferably not less than 1500° C., for a predetermined period of time, and then, formation of the crystal layer 4 to be described next is performed. The reason for heating at a temperature of not less than 1250° C. is because heat treatment in a higher temperature range than when heating the base 1 during the formation of the underlying layer 2 produces at least the effect of reducing dislocations. In general, a deposition technique such as the MOCVD process is a technique for forming a film by using a non-equilibrium reaction. Thus, a greater number of crystal defects (such as dislocations) than those existing in a state of thermal equilibrium are considered to be present in a kind of frozen-like state in the epitaxial film on the base 1. It can be inferred that heating to a temperature of not less than 1250° C. causes the state of thermal equilibrium to be approached, thereby reducing dislocations. Heating at a temperature of not less than 1400° C. means performing heat treatment in a temperature range that can remarkably produce the effect of reducing dislocations resulting from combined disappearance of dislocations which will be described later. Further, heating at a temperature of not less than 1500° C. allows such effect of heat treatment to be acquired in a shorter time.

Such heat treatment may follow close on the formation of the underlying layer 2 in the same processing apparatus. Alternatively, the formation of the underlying layer 2 and the heat treatment may be performed in separate processing apparatuses, respectively. The latter is advantageous in being able to perform the deposition process and the heating process in separate apparatuses suitable for the respective processes.

It is desirable that an atmosphere during the heat treatment be an atmosphere containing nitrogen to prevent the decomposition of the group-III nitride. For example, an atmosphere containing a nitrogen gas and an ammonia gas may be used. Regarding pressure conditions during the heat treatment, it is ascertained that the crystal quality is improved at any level of pressure ranging from a reduced pressure to an increased pressure.

A member for controlling impurities in a gas such as a hydrogen component, an oxygen component and a carbon component may be provided within a processing apparatus for use in the heating process. Also, a tool for fixing the epitaxial substrate 3 may have this function.

As is conducted at high temperatures as described above, it is therefore desirable to perform the heat treatment in a temperature range not exceeding the melting point of the base 1 or in a temperature range in which the reaction product of the base 1 and the underlying layer 2 is not remarkably formed, that is, in which an excessive reaction does not cause the degradation of the underlying layer 2 in crystal quality.

However, the formation of the entire or local ultrathin reaction product at the interface between the base 1 and the underlying layer 2 by heat treatment is not excluded from the present invention. In some cases, the presence of such an ultrathin reaction product is rather preferable because the reaction product functions as a buffer layer for reduction in the number of dislocations and the like. From this viewpoint, sapphire, MgO and SiC which have a high melting point are desirable as the material of the base 1.

In the light of the stability of the crystal structure against heating, it is preferable that the underlying layer 2 be made of a group-III nitride crystal having a wurtzite structure.

As the content of Al in the group-III nitride crystal constituting the underlying layer 2 increases, the effect of reducing dislocations by heat treatment is improved more. Such an effect is most remarkable in the case of AlN. This is because a group-III nitride containing a large amount of Al has a higher melting point than GaN and InN which are also group-III nitrides and is less susceptible to the crystal quality degradation due to thermal decomposition, so that the effect of reducing dislocations at high temperatures can be utilized most effectively.

Figure 2:
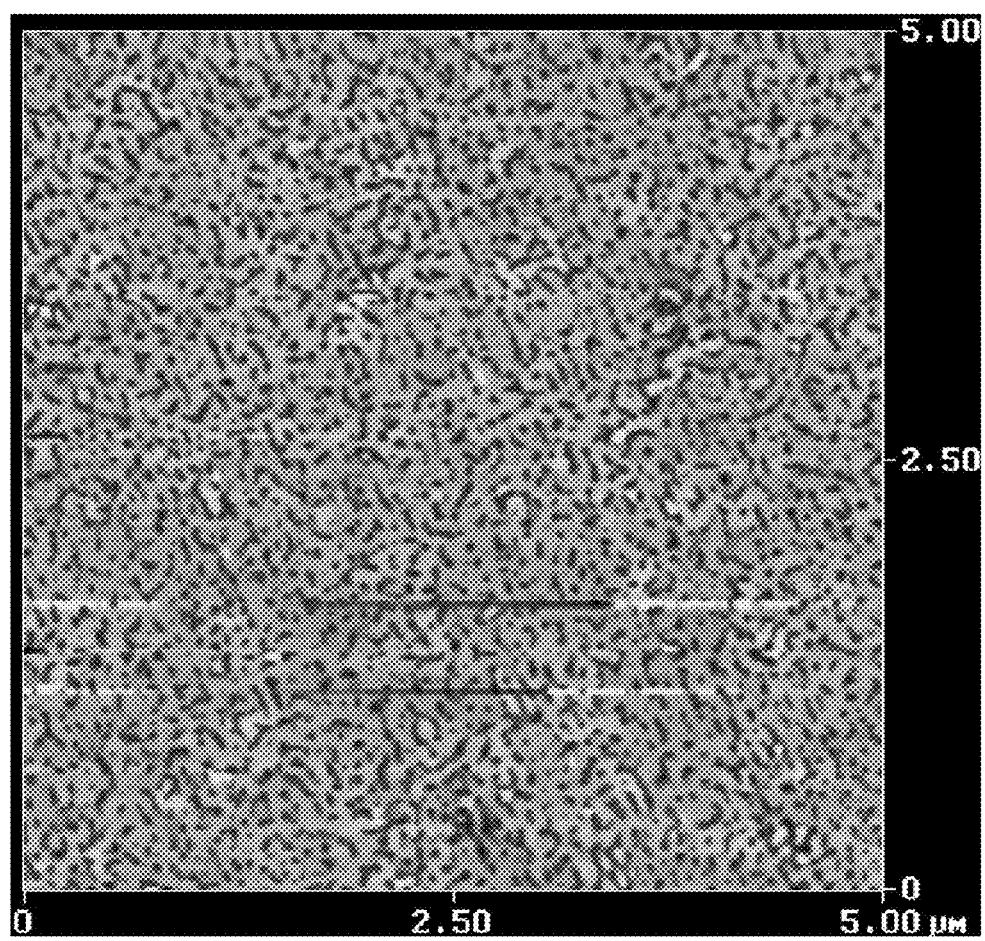
FIG. 2 illustrates an AFM image of a surface of an underlying layer before conducting heat treatment on an underlying substrate.
Figure 3:
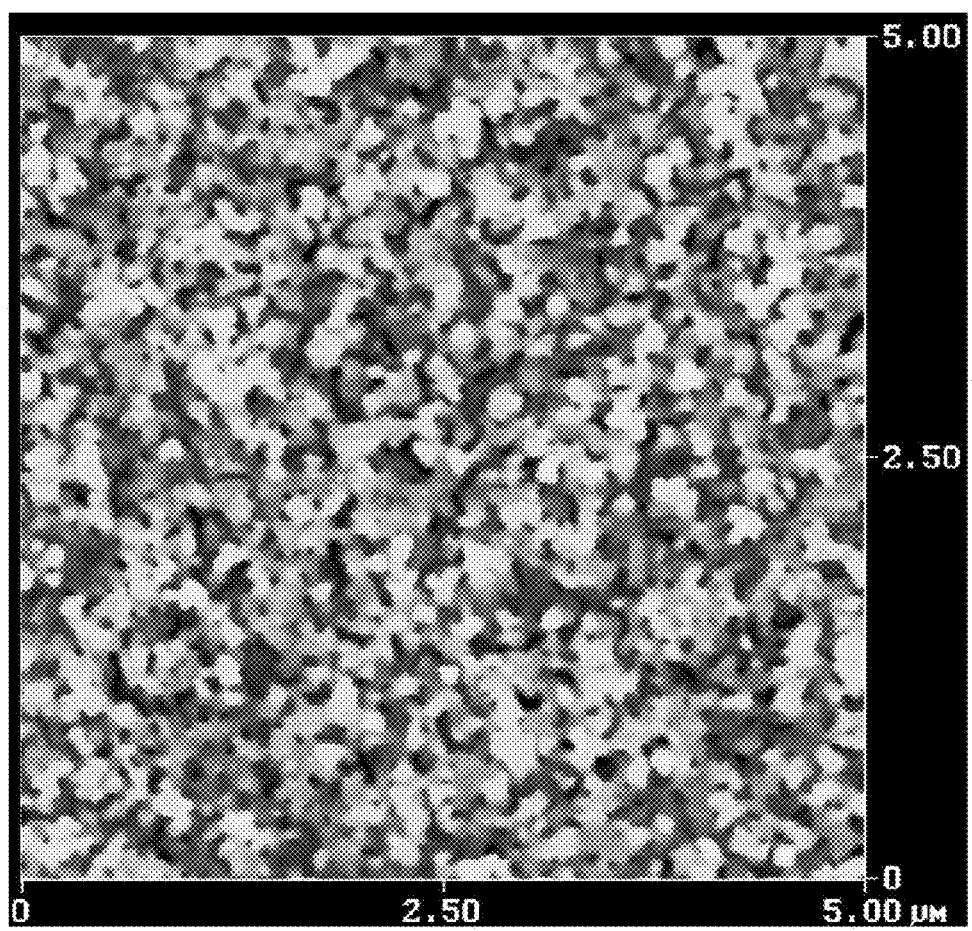
FIG. 3 illustrates an AFM image of the surface of the underlying layer after conducting the heat treatment on the underlying substrate.

FIGS. 2 and 3 respectively illustrate AFM (atomic force microscopy) images of a surface of the underlying layer 2 before and after the heat treatment. These examples were obtained by heating the underlying substrate 3 with the underlying layer 2 formed of AlN using (0001) sapphire as the material of the base 1 at 1650□ for 5 minutes.

As understood from FIGS. 2 and 3, the underlying layer 2 before the heat treatment has a geometry with a great many fine pits distributed within a substantially flat surface. The surface roughness (average roughness) ra in a 5-by 5-μm square region measured by AFM in this case is not more than 1 to 5 nm. After the heat treatment, on the other hand, three-dimensional irregularities are formed at random by a great many fine crystalline islands. Projecting crystalline islands are observed as existing at almost the same height. Such a three-dimensional irregular geometry is also called a textured geometry. Each crystalline island has a dimension of about several tens nanometers in an inplane direction parallel to the drawing. The surface roughness ra is not more than 1 to 5 nm, which is almost the same as before the heat treatment. That is, the aforementioned heat treatment can be considered as an irregularity promoting process or geometry changing process for increasing the frequency of fine irregularities while keeping the average roughness equivalent at the surface of the underlying layer 2. An increase in heat treatment time will flatten such irregularities on the surface of the underlying layer 2, which makes the surface continuously flat. Accordingly, the heat treatment time needs to be set appropriately such that the irregularities are not impaired.

For the group-III nitride crystal, there generally can be two types of dislocations: screw dislocations and edge dislocations. The edge dislocations principally thread through the underlying layer 2 as epitaxially formed yet to be subjected to the heat treatment from the interface with the base 1 toward the surface of the underlying layer 2. However, atomic diffusion is promoted along with the formation of three-dimensional irregularities on the surface of the underlying layer 2 through the aforementioned heat treatment, causing the dislocations to move. This in result promotes combined disappearance of dislocations having Burgers vectors of opposite directions to each other. More specifically, a dislocation density of the underlying layer 2 before the heat treatment is typically about $5 \times 10^{10}/cm^2$ or more, which is reduced to about $5 \times 10^9/cm^2$ by the heat treatment. The FWHM (full width at half maximum) for the (0002) plane by X-ray rocking curve measurement before the heat treatment is about 90 seconds, and the FWHM for the (10-12) plane is about 2000 seconds. In contrast, the FWHM after the heat treatment are about 120 and 800 seconds, respectively.

Particularly when forming the underlying layer 2 by AlN, the aforementioned effect of reducing dislocations is found not only at the surface of the underlying layer 2, but also in a range of about 0.01 µm in the vicinity of the interface between the base 1 and underlying layer 2 to the same degree as at the surface. This is because the heat treatment causes a plurality of edge dislocations to be combined together to disappear also in the vicinity of the interface with the base 1.

It should be noted that the purpose of forming the crystal layer 4 upon conducting the aforementioned heat treatment is not only to cause such combined disappearance of the edge dislocations. This will be described later.

The thickness of the underlying layer 2 is not specifically limited only if random three-dimensional irregularities resulting from the aforementioned crystalline islands are formed after the heat treatment. For example, the thickness of the underlying layer 2 ranging from about several nanometers to about several millimeters is assumed. In terms of manufacturing efficiency, however, it is preferable that the underlying layer 2 be made as thin as possible. The thickness of not more than 0.5 µm is preferable in terms of utilizing three-dimensional nuclei voluntarily formed in the early stage of growth on the base 1. When the underlying layer 2 is thick, it may become a continuous film by a horizontal growth of the three-dimensional nuclei, so that three-dimensional irregularities cannot be formed in some cases. In addition, the underlying layer 2 is preferably a layer grown at not less than 1000° C., rather than a so-called low-temperature buffer layer grown to be amorphous. An extremely thin low-temperature buffer layer that does not essentially affect the crystal quality and irregular geometry may be inserted.

On the other hand, in light of the aforementioned reduced dislocations, the underlying layer 2, when formed of AlN, needs to have a thickness of not less than 5 nm because combined disappearance of edge dislocations almost terminates within such a thickness.

Further, the composition of the underlying layer 2 illustrated herein is an average composition, and need not always be homogeneous throughout the layer. For example, a gradually varying composition may be employed, or a stress relaxation layer having a different composition may be inserted into the underlying layer 2.

Impurities such as H, C, O, Si and transition metals that are inevitably contained in the underlying layer 2 during the formation of the underlying layer 2 may be present within the underlying layer 2. The underlying layer 2 may contain impurities such as Si, Ge, Be, Mg, Zn and Cd intentionally introduced for the purpose of electrical conductivity control.

The crystal layer 4 is formed on the underlying substrate 3 having undergone the aforementioned heat treatment, more specifically, on the underlying layer 2. The crystal layer 4 is an epitaxial film made of a second group-III nitride formed by the same deposition process as that used for the aforementioned underlying layer 2. The thickness of the crystal layer 4 is not specifically limited, but is selected so as to be optimum for a device structure to be used finally or for type of usage. For example, the thickness of the crystal layer 4 ranging from about several nanometers to about several millimeters is assumed.

The crystal layer 4 is preferably formed such that the lattice constant of the second group-III nitride satisfies the aforementioned conditions. The composition of the crystal layer 4 illustrated herein is an average composition, and need not always be homogeneous throughout the layer. For example, a gradually varying composition may be employed, or a stress relaxation layer having a different composition may be inserted. For instance, in the case of adopting the MOCVD process, the crystal layer 4 can be formed by setting the temperature of the underlying substrate 3 (i.e., temperature of the base 1) at not more than 1250° C.

Figure 4:
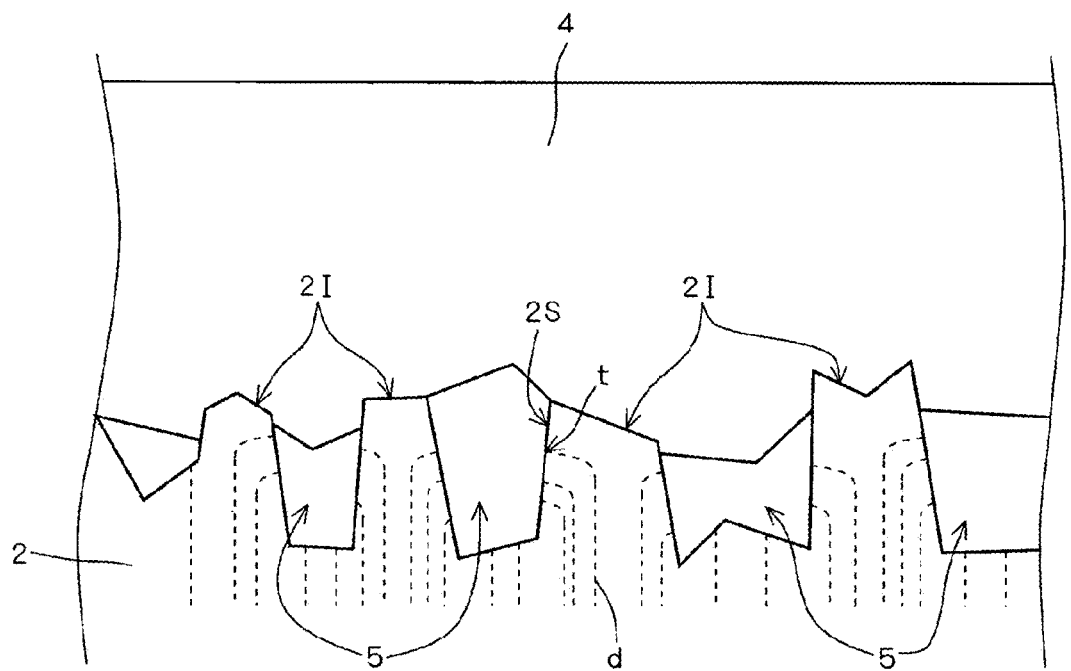
FIG. 4 is a schematic view of and around the interface between the underlying layer and crystal layer.

FIG. 4 is a schematic view of and around the interface between the underlying layer 2 and crystal layer 4. At the interface between these layers, a fine void 5 can be seen in a valley between each adjacent crystalline islands 2I (i.e., a recess in the surface of the underlying layer 2), as illustrated in FIG. 4. A plurality of such voids 5 exist at the interface discretely. The existence of such voids 5 is assumed to result from that the second group-III nitride does not necessarily go into the recesses in the surface of the underlying layer 2 without any gap during the epitaxial growth of the crystal layer 4 on the underlying layer 2 having the above-described fine irregular geometry.

With such interface structure, even if a dislocation d originally present in the underlying layer 2 or newly generated at the interface threads through the underlying layer 2 to reach a side surface 2S of the crystalline island 2I, the dislocation d has an end t at the side surface 2S because of the presence of the void 5, and does not propagate into the crystal layer 4. It is assumed that a great many voids 5 present at the interface cause many of the dislocations in the underlying layer 2 to similarly terminate when reaching the voids 5. For instance, the crystal layer 4 made of $Al_{0.5}Ga_{0.5}N$ in 2 µm thickness on the underlying layer 2 illustrated in FIG. 3 has a dislocation density of about $1 \times 10^9/cm^2$, which is significantly smaller than the dislocation density of the underlying layer 2 after the heat treatment. This, in other words, means that the presence of voids 5 prevents the dislocations from propagating into the crystal layer 4 from the underlying layer 2.

Of course, the dislocation density of the underlying layer 2 has been reduced by the heat treatment, so that propagation of dislocations is prevented per se at positions where no voids 5 exist, i.e., where the underlying layer 2 and crystal layer 4 are in contact with each other, as compared to the case of not conducting heat treatment. It can be said that this also contribute synergistically to the reduction of dislocation density in the crystal layer 4.

The X-ray rocking curve FWHM for the (0002) plane of the crystal layer 4 is 200 seconds, the FWHM for the (10-12) plane is about 500 seconds, so that it can be said that the crystal layer 4 has a good crystal quality.

That is, such crystal layer 4 having a small dislocation density with a good crystal quality is obtained by forming it on the underlying layer 2 having the aforementioned surface irregularities with voids interposed at the interface.

In other words, forming the crystal layer 4 on the underlying substrate 3 with the great many fine voids 5 interposed at the interface with the underlying substrate 3 can prevent propagation of the dislocations from the underlying substrate 3 and allows the crystal layer 4 of good crystal quality to be obtained.

Conducting the heat treatment on the underlying substrate 3 prior to the formation of the crystal layer 4 has a main object of intentionally creating the state in which the great many voids 5 are interposed at the interface between the underlying layer 2 and crystal layer 4. The use of a geometry changing technique is not excluded if irregularities can be formed on the surface of the underlying layer 2 similarly to the case of conducting the heat treatment.

As described above, according to the present embodiment, by epitaxially forming on an underlying substrate having a fine irregular geometry resulting from crystalline islands, a crystal layer of a group-III nitride having a good crystal quality can be formed, and further, the underlying substrate having such an irregular geometry can easily be prepared only by a predetermined heat treatment on a so-called epitaxial substrate obtained by epitaxially forming a group-III nitride crystal on a predetermined base.

In other words, a group-III nitride crystal of good crystal quality can be obtained on a so-called epitaxial substrate only by conducting a simple heat treatment. Further, a layered structure itself obtained by forming a crystal layer of a group-III nitride crystal having a good crystal quality as described above on an underlying substrate may be used as an epitaxial substrate.

EXAMPLES

FIG. 5 is a table of numeric values of heat treatment conditions as well as numeric values of crystal quality of an obtained underlying layer and a crystal layer according to an inventive example and comparative examples which will be described below.

Inventive Example

In Inventive Example, the underlying substrate 3, a so-called epitaxial substrate, was obtained by using (0001) sapphire as the material of the base 1 and epitaxially forming an AlN layer having a main surface coincident with the (0001) plane thereof in 0.2 μm thickness as the underlying layer 2 by the MOCVD process at 1200° C. and 10 Torr. At this time, the surface of the base 1 is nitrided to create a surface nitride layer prior to forming the AlN layer for the purpose of improving the crystal quality of the AlN layer. Evaluation of crystal quality of the formed AlN layer has revealed that the FWHM for the (0002) plane by X-ray rocking curve measurement was 90 seconds, the FWHM for the (10-12) plane was 2000 seconds. The dislocation density was $5\times10^{10}/cm^2$. The X-ray rocking curve measurement was made using an open slit by an ω scan process. This is to measure the tilt component of crystal orientation fluctuations from the c-axis of AlN when the (0002) plane is used, and to principally measure the twist component of the crystal orientation fluctuations about the c-axis of AlN when the (10-12) plane is used. FIG. 2 shows an AFM image of the underlying substrate 3 obtained in this manner. It is apparent from FIG. 2 that the underlying substrate 3 (AlN layer as the underlying layer 2) has a geometry with great many fine pits distributed in an almost flat surface. The surface roughness (ra) in a 5-by 5-μm square region by the AFM measurement was not more than 1 to 5 nm.

Next, the underlying substrate 3 obtained in this manner was placed in a predetermined position within a reaction chamber of a predetermined heat treatment furnace. A nitrogen gas was supplied into the reaction chamber while the reaction chamber was maintained at 1 atm, and heat treatment was performed under the following three conditions: (1) at a temperature of 1650° C. for 10 minutes; (2) at a temperature of 1550° C. for 10 hours; and (3) at a temperature of 1450° C. for 20 hours, respectively. The evaluation of the crystal quality after the heat treatment was as follows: the X-ray rocking curve FWHM for the (0002) plane was 120 seconds under all of the conditions (1) to (3); and the X-ray rocking curve FWHM for the (10-12) plane was 800 seconds under the conditions (1) and (2) and 1100 seconds under the condition (3). The dislocation density was $5\times10^9/cm^2$ under the conditions (1) and (2) and $1\times10^{10}/cm^2$ under the condition (3). FIG. 3 shows an AFM image of the underlying substrate 3 after the heat treatment under the condition (1). It is apparent from FIG. 3 that the underlying substrate 3 (AlN layer as the underlying layer 2) has a surface with three-dimensional irregularities resulting from a great many fine crystalline islands formed thereon at random. Each crystalline island has an inplane dimension of about several tens nanometers. The surface roughness ra was not more than 1 to 5 nm, which is similar to that prior to the heat treatment.

Next, an $Al_{0.5}Ga_{0.5}N$ layer was formed in 2 μm thickness as the crystal layer 4 on the underlying substrate 3 having undergone the heat treatment by the MOCVD process at 1150° C. and 50 Torr to obtain three types of layered structures 10 corresponding to the respective heat treatment conditions. Evaluation of crystal quality of the $Al_{0.5}Ga_{0.5}N$ layer was as follows: the X-ray rocking curve FWHM for the (0002) plane was 200 seconds, the FWHM for the (10-12) plane was 400 seconds and the dislocation density was $1\times10^9/cm^2$ under the heat treatment conditions (1) and (2). The X-ray rocking curve FWHM for the (0002) plane was 200 seconds, the FWHM for the (10-12) plane was 700 seconds, and the dislocation density was $4\times10^9/cm^2$ under the heat treatment condition (3). Observation of the cross section of the respective layered structures 10 after the formation of the crystal layer 4 revealed that each of the layered structures 10 had a great many fine voids 5 at and around the interface between the underlying layer 2 and crystal layer 4.

Comparative Example 1

In Comparative Example 1, an $Al_{0.5}Ga_{0.5}N$ layer was formed under the same condition as in Inventive Example, except that heat treatment was not conducted. Evaluation of crystal quality of the obtained $Al_{0.5}Ga_{0.5}N$ layer was as follows: the X-ray rocking curve FWHM for the (0002) plane was 150 seconds, the FWHM for the (10-12) plane was 1100 seconds and the dislocation density was $1\times10^{10}/cm^2$.

Comparative Example 2

In Comparative Example 2, an $Al_{0.5}Ga_{0.5}N$ layer was formed under the same condition as the condition (1) in Inventive Example, except that heat treatment was conducted for 2 hours. Evaluation of crystal quality of the obtained AlN layer after the heat treatment was as follows: the X-ray rocking curve FWHM for the (0002) plane was 150 seconds, the FWHM for the (10-12) plane was 750 seconds and the dislocation density was $5\times10^9/cm^2$. The surface roughness (ra) in a 5-by 5-μm square region at the surface of the AlN layer after the heat treatment was not more than 0.3 nm, and steps at the atomic level were clearly observed in an AFM image. That is, the AlN layer after the heat treatment in Comparative Example 2 had a flat surface at the atomic level, different from Inventive Example.

Further, evaluation of crystal quality of the $Al_{0.5}Ga_{0.5}N$ layer was as follows: the X-ray rocking curve FWHM for the (0002) plane was 200 seconds, the FWHM for the (10-12) plane was 700 seconds, and the dislocation density was $4\times10^9/cm^2$. Observation of the cross-section of the layered structure 10 after the formation of the crystal layer 4 reveals that there was no void 5 at and around the interface between the underlying layer 2 and crystal layer 4.

Comparison between Inventive Example and Comparative Example 1 reveals that the $Al_{0.5}Ga_{0.5}N$ layer in the former case has a smaller dislocation density than in the latter case. In other words, it is found that the heat treatment conducted in Inventive Example contributes to reduction in dislocation density of the crystal layer.

Further, comparison between the heat treatment condition (1) in Inventive Example and Comparative Example 2 reveals that the $Al_{0.5}Ga_{0.5}N$ layer in the former case where voids were observed has a smaller dislocation density than in the latter case where no void was observed. In other words, it is found that increased frequency of irregularities on the surface of the underlying layer by heat treatment and the presence of a great many voids at the interface with the crystal layer formed thereafter contribute to the reduction in dislocation density in the crystal layer.

While the invention has been shown and described in detail, the foregoing description is in all aspects illustrative and not restrictive. It is therefore understood that numerous modifications and variations can be devised without departing from the scope of the invention.

What is claimed:

1. A layered structure comprising:
   a substrate including a base layer and an AlN underlying layer of a first group-III nitride epitaxially formed on said base layer; and
   a crystal layer made of a second group-III nitride, wherein an inplane lattice constant of said AlN is less than an inplane lattice constant of said second group-III nitride;
   wherein, before a heating process that is different from an epitaxial forming process, a surface of said underlying layer has a geometry defined by surface irregularities comprising a plurality of fine pits distributed within a substantially flat surface;
   wherein, after the heating process that is different from an epitaxial forming process, a textured geometry is provided on an entire surface of said underlying layer, said textured geometry being defined by surface irregularities comprising a plurality of crystalline island projections, so that a frequency of said surface irregularities of said irregular geometry of said textured geometry after said heating process is larger than a frequency of said surface irregularities of said geometry of said underlying layer before said heating process, and so that a surface roughness of said underlying layer is 1 to 5 nm;
   wherein voids defined by said textured geometry of said underlying layer exist discretely at an interface between said crystal layer and said underlying layer; and
   wherein said crystal layer is adjacent only to said underlying layer and said voids.

2. An epitaxial substrate comprising:
   a substrate including a base layer and an AlN underlying layer of a first group-III nitride epitaxially formed on said base layer; and
   a crystal layer made of a second group-III nitride, wherein an inplane lattice constant of said AlN is less than an inplane lattice constant of said second group-III nitride;
   wherein, before a heating process that is different from an epitaxial forming process, a surface of said underlying layer has a geometry defined by surface irregularities comprising a plurality of fine pits distributed within a substantially flat surface;
   wherein, after the heating process that is different from an epitaxial forming process, a textured geometry is provided on the entire surface of said underlying layer, said textured geometry being defined by surface irregularities comprising a plurality of crystalline island projections, so that a frequency of said surface irregularities of said irregular geometry of said textured geometry after said heating process is larger than a frequency of said surface irregularities of said geometry of said underlying layer before said heating process, and so that a surface roughness of said underlying layer is 1 to 5 nm;
   wherein voids defined by said textured geometry of said underlying layer exist discretely at an interface between said crystal layer and said underlying layer; and
   wherein said crystal layer is adjacent only to said underlying layer and said voids.

* * * * *